United States Patent [19]

Marley et al.

[11] Patent Number: 4,598,213

[45] Date of Patent: Jul. 1, 1986

[54] BIPOLAR TRANSIENT DRIVER

[75] Inventors: Robert R. Marley; Mark S. Birrittella, both of Phoenix, Ariz.

[73] Assignee: Motorola, Inc., Schaumburg, Ill.

[21] Appl. No.: 653,613

[22] Filed: Sep. 24, 1984

[51] Int. Cl.$^4$ .................. H03K 17/60; H03K 17/68; H03K 17/04

[52] U.S. Cl. .................. 307/270; 307/246; 307/255; 307/280

[58] Field of Search ............ 307/443, 454, 455–458, 307/246, 255, 270, 280, 300, 475

[56] References Cited

U.S. PATENT DOCUMENTS

| | | | |
|---|---|---|---|
| 3,798,471 | 3/1974 | Williams et al. | 307/270 X |
| 3,854,057 | 12/1974 | Williams | 307/270 X |
| 4,274,018 | 6/1981 | Cave et al. | 307/456 X |
| 4,287,435 | 9/1981 | Cavaliere et al. | 307/270 X |
| 4,419,593 | 12/1983 | Butler et al. | 307/443 X |
| 4,469,961 | 9/1984 | Milberger et al. | 307/270 |
| 4,471,241 | 9/1984 | Nagano | 307/475 |
| 4,508,976 | 4/1985 | Hickman et al. | 307/270 |
| 4,536,662 | 8/1985 | Fujii | 307/270 |
| 4,553,044 | 11/1985 | Bittner | 307/270 |

OTHER PUBLICATIONS

Dorler et al., "Complementary Emitter Follower Driver"; *IBM TDB;* vol. 22, No. 8A, p. 3223; 1/1980.

*Primary Examiner*—Larry N. Anagnos
*Attorney, Agent, or Firm*—William E. Koch

[57] ABSTRACT

A bipolar transient driver for quickly charging and discharging a capacitive load is provided that comprises a means for biasing the base-emitter voltage of a PNP transistor having a high gain-bandwidth product which draws current away from the load as the transient driver output signal transitions downward. The PNP transistor having a high gain-bandwidth product, as well as one or more remaining PNP transistors disclosed in several embodiments, are monolithically integrated in a vertical structure.

5 Claims, 4 Drawing Figures

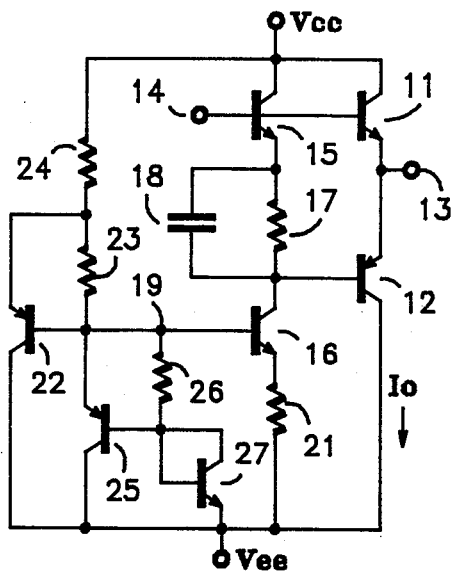
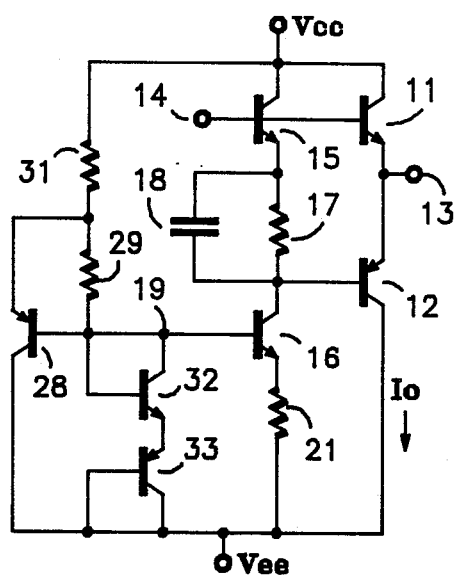
*FIG. 1*  *FIG. 2*
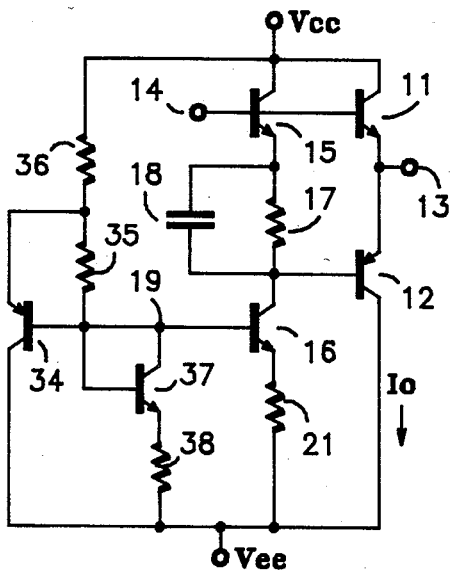
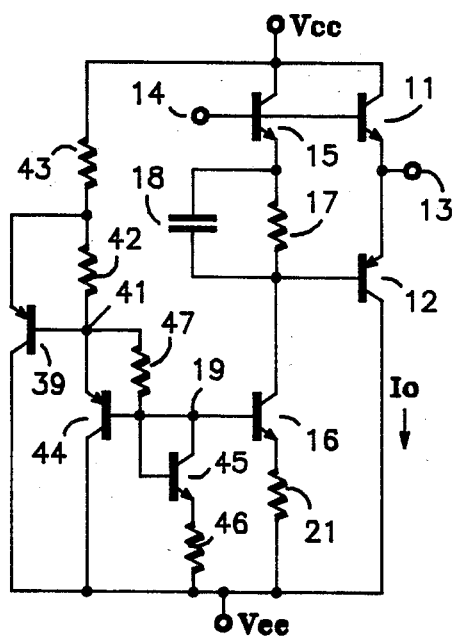
*FIG. 3*  *FIG. 4*

BIPOLAR TRANSIENT DRIVER

BACKGROUND OF THE INVENTION

1. Field of the Invention

This invention relates generally to a bipolar transient driver circuit and, more particularly, to a monolithically integrated AC bipolar transient driver for quickly charging and discharging a large capacitance while maintaining a low power requirement.

2. Background Art

A number of circuits exist that inherently have a relative large capacitance appearing at their input terminal. For example, the capacitive metal interconnects of a gate array present input signal transition difficulties. Also, the capacitance within a memory cell slows down its response to an input signal.

One known transition circuit comprises an NPN transistor coupled between supply voltage $V_{CC}$ and an output terminal (the input terminal of the capacitive circuit) and responsive to an input signal for driving the capacitive circuit positive. An NPN discharge transistor has a collector connected to the output terminal of the transition circuit and an emitter coupled to supply voltage $V_{EE}$ by a resistor. However, in order to discharge the capacitance quickly, the resistance must be small. This results in an undesirably large current.

Another known transition circuit, for increasing the downward transition of a memory cell, comprises an NPN transistor responsive to a select signal and coupled to a select line for providing current to a plurality of memory cells. A first PNP transistor has a collector coupled to supply voltage $V_{EE}$ and an emitter coupled to a current drain line for drawing any charge from the plurality of memory cells when the select signal transitions downward. Means are coupled to the base of the first PNP transistor and are responsive to the select signal for setting the current level in the first PNP transistor. A second PNP transistor has an emitter coupled to the select line and a collector coupled to supply voltage $V_{EE}$ for removing charge stored on the select line. The second PNP transistor has its collector isolated from the substrate, limiting circuit high frequency operation. Also, emitter-base forward voltage mismatch occurs between the isolated and non-isolated devices.

Thus, what is needed is an improved AC bipolar transient driver circuit that charges and discharges a large capacitance at its output terminal quickly and with low current requirements.

SUMMARY OF THE INVENTION

Accordingly, it is an object of the present invention to provide an improved bipolar transient driver circuit.

Another object of the present invention is to provide a bipolar transient driver circuit having improved discharging characteristics.

In carrying out the above and other objects of the invention in one form, there is provided a bipolar transient circuit comprising a pair of push-pull transistors including a PNP transistor and a first NPN transistor having a base coupled to an input terminal. An output terminal is coupled between emitters of the PNP and first NPN transistors. A second NPN transistor has a base coupled to the input terminal and an emitter coupled to the base of the PNP transistor by a first resistor. A third NPN transistor has a collector coupled to the base of the PNP transistor and a base coupled to means for establishing a predetermined current through the third NPN transistor. The PNP transistor has a high gain-bandwidth product for quickly drawing current (capacitive charge) away from the output terminal. The PNP transistor and additional PNP transistors in the circuit are all vertically structured and have their collectors comprising the substrate of the integrated circuit. The substrate is adapted to receive the supply voltage $V_{EE}$.

The above and other objects, features, and advantages of the present invention will be better understood from the following detailed description taken in conjunction with the accompanying drawings.

BRIEF DESCRIPTION OF THE DRAWINGS

FIG. 1 is a schematic of a first embodiment of the present invention.

FIG. 2 is a schematic of a second embodiment of the present invention.

FIG. 3 is a schematic of a third embodiment of the present invention.

FIG. 4 is a schematic of a fourth embodiment of the present invention.

DETAILED DESCRIPTION OF THE INVENTION

Referring to FIG. 1, a first embodiment of the present invention comprises NPN transistor 11 and PNP transistor 12 having their emitters connected to output terminal 13 and their collectors connected to supply voltage terminals $V_{CC}$ and $V_{EE}$, respectively. Transistor 11 has its base connected to input terminal 14 for receiving a digital input signal. When the digital input signal transitions positive, transistor 11 provides current to output terminal 13 thereby charging any circuitry connected thereto to a selected voltage potential. Due to the beta multiplication of NPN transistors, this positive transition occurs relatively rapidly. PNP transistor 12, when enabled, pulls current away from output terminal 13 in a manner described subsequently hereto. Since the current $I_O$ from the collector of transistor 12 varies exponentially with the base-emitter voltage of transistor 12, the base-emitter voltage must be very stable in order to maintain a well controlled current $I_O$.

NPN transistor 15 has a collector connected to supply voltage terminal $V_{CC}$, a base connected to input terminal 14 and an emitter coupled to the base of transistor 12 and the collector of NPN transistor 16 by resistor 17. A capacitor 18 is in parallel with resistor 17. Transistor 16 has a base connected to node 19 and an emitter coupled to supply voltage terminal $V_{EE}$ by resistor 21. The connections and operation of the portion of the circuit just described is common for all four embodiments described herein; therefore, for ease of description, the reference numerals will be identical for that portion of the circuit of FIGS. 1-4.

PNP transistor 22 has a collector connected to supply voltage terminal $V_{EE}$, a base connected to node 19, and an emitter coupled to node 19 by resistor 23 and to supply voltage terminal $V_{CC}$ by resistor 24. Transistor 22 and resistor 23 set the current supplied to node 19. PNP transistor 25 has a collector connected to supply voltage terminal $V_{EE}$, an emitter connected to node 19, and a base coupled to node 19 by resistor 26 and connected to the base and collector of transistor 27. The emitter of transistor 27 is connected to supply voltage terminal $V_{EE}$. The base-emitter voltage of transistor 25 appears across resistor 26. Since the base-emitter voltages of transistors 27 and 16 are substantially equal, the voltage across resistor 26 appears across resistor 21. Since the current through resistor 21 substantially equals the current through resistor 17, the voltage across resistor 17 substantially equals the voltage across resistor 21, assuming resistors 17 and 21 have the same ohmic value. And since the base-emitter voltage of transistors 11 and 15 are made equal, the base-emitter voltage of transistor 12 equals the voltage across resistor 17. Therefore, the collector current $I_O$ of transistor 12 is well controlled. When the output signal goes high, a resistance-capacitance time delay is experienced due to resistor 17 and base nodal capacitance of PNP transistor 12. Capacitor 18 assists in accelerating the positive voltage transition at the base of transistor 12 allowing transistor 12 to turn off more quickly.

PNP transistors 12, 22, and 25 are vertical transistors wherein their collectors comprise the substrate of a monolithically integrated circuit which is coupled to voltage $V_{EE}$. Transistor 12 comprises a device having a high gain-bandwidth product, or a high transition frequency at which the current gain of the device has fallen to unity (i.e., at least 1 gigahertz).

Referring to FIG. 2, a second embodiment comprises PNP transistor 28 having a collector connected to supply voltage terminal $V_{EE}$, a base connected to node 19, and an emitter coupled to node 19 by resistor 29 and to supply voltage terminal $V_{CC}$ by resistor 31. NPN transistor 32 has a base and a collector connected to node 19, and an emitter connected to the emitter of PNP transistor 33. Transistor 33 has a base and a collector connected to supply voltage terminal $V_{EE}$. Transistor 28 and resistor 29 set the current to transistors 32 and 33 through node 19. Since the base-emitter voltage of transistor 32 is made equal to base-emitter voltage of transistor 16, the voltage appearing across resistor 21 equals the base-emitter voltage of transistor 33. As described in greater detail for FIG. 1, the current through transistor 16 and resistor 21 set the current through resistor 17, and therefore the base-emitter voltage of transistor 12.

Referring to FIG. 3, a third embodiment comprises PNP transistor 34 having a collector connected to supply voltage terminal $V_{EE}$, a base connected to node 19, and an emitter coupled to node 19 by resistor 35 and to supply voltage terminal $V_{CC}$ by resistor 36. NPN transistor 37 has a base and collector connected to node 19 and an emitter coupled to supply voltage terminal $V_{EE}$ by resistor 38. The current through resistors 35 and 38 is approximately equal to the base-emitter voltage of transistor 34 divided by the resistance of resistor 35. By having the resistances of resistors 35 and 38 equal, than the base-emitter voltage of transistor 34 equals the voltage across resistor 38. Since the base-emitter voltages of transistors 16 and 37 are equal, the voltage appearing across resistor 21 equals the voltage across resistor 38. As described in greater detail for FIG. 1, the current through transistor 16 and resistor 21 set the current through resistor 17, and therefore the base-emitter voltage of transistor 12.

Referring to FIG. 4, a fourth embodiment comprises PNP transistor 39 having a collector connected to supply voltage terminal $V_{EE}$, a base connected to node 41, and an emitter coupled to node 41 by resistor 42 and to supply voltage terminal $V_{CC}$ by resistor 43. PNP transistor 44 has a collector connected to supply voltage terminal $V_{EE}$, a base connected to node 19, and an emitter connected to node 41. NPN transistor 45 has a base and collector connected to node 19 and an emitter coupled to supply voltage terminal $V_{EE}$ by resistor 46. Resistor 47 is coupled between nodes 19 and 41. Transistor 39 and resistor 42 set the current to node 41. The voltages across resistors 46 and 47 will be equal. Since the base-emitter voltages of transistors 16 and 45 are equal, the voltage appearing across resistor 21 will equal the voltage across resistor 46. As described in greater detail for FIG. 1, the current through transistor 16 and resistor 21 set the current through resistor 17, and therefore the base-emitter voltage of transistor 12.

By now it should be appreciated that there has been provided a bipolar transient driver for quickly charging and discharging capacitive voltages appearing at its output terminal.

We claim:

1. A circuit comprising:
   a first voltage terminal;
   a second voltage terminal;
   first means for receiving an input signal having a high state and a low state;
   a pair of push pull transistors comprising a first PNP transistor and a first NPN transistor, said first NPN transistor having a base coupled to said first means and a collector coupled to said first voltage terminal, said first PNP transistor having a collector coupled to said second voltage terminal;
   an output terminal coupled to the emitters of said first NPN transistor and said first PNP transistor wherein a capacitive load is quickly charged when said input signal is in said high state and is quickly discharged when said input signal is in said low state;
   a second NPN transistor having a base coupled to said first means and a collector coupled to said first voltage terminal;
   second means for providing a resistance coupled between an emitter of said second NPN transistor and a base of said first PNP transistor;
   a third NPN transistor having a collector coupled to said base of said first PNP transistor;
   third means for providing a resistance coupled between an emitter of said third NPN transistor and said second voltage terminal; and
   fourth means coupled between said first and second voltage terminals and coupled to a base of said third NPN transistor for establishing a predetermined current through said third means.

2. The circuit according to claim 1 wherein said fourth means comprises:
   fifth means for providing a resistance;
   sixth means for providing a resistance;
   a second PNP transistor having a collector coupled to said second voltage terminal and an emitter coupled to said first voltage terminal by said fifth means and to its base and said base of said third NPN transistor by said sixth means;
   a third PNP transistor having an emitter coupled to said base of said third NPN transistor, and a collector coupled to said second voltage terminal;
   seventh means for providing a resistance; and
   a fourth NPN transistor having an emitter coupled to said second voltage terminal, and a base and a collector coupled to one another, to a base of said third PNP transistor, and to said base of said third NPN transistor by said seventh means.

3. The circuit according to claim 1 wherein said fourth means comprises:
   fifth means for providing a resistance;

sixth means for providing a resistance;
a second PNP transistor having a collector coupled to said second voltage terminal and an emitter coupled to said first voltage terminal by said fifth means and to its base and said base of said third NPN transistor by said sixth means;
a fourth NPN transistor having a base and a collector coupled to said base of said third NPN transistor; and
a third PNP transistor having an emitter coupled to an emitter of said fourth NPN transistor, and a base and a collector coupled to said second voltage terminal.

4. The circuit according to claim 1 wherein said fourth means comprises:
fifth means for providing a resistance;
sixth means for providing a resistance;
a second PNP transistor having a collector coupled to said second voltage terminal and an emitter coupled to said first voltage terminal by said fifth means and to its base and said base of said third NPN transistor by said sixth means;
a fourth NPN transistor having a base and a collector coupled to said base of said third NPN transistor; and
a resistor coupled between an emitter of said fourth NPN transistor and said second voltage terminal.

5. The circuit according to claim 1 wherein said fourth means comprises:
fifth means for providing a resistance;
sixth means for providing a resistance;
a second PNP transistor having a collector coupled to said second voltage terminal and an emitter coupled to said first voltage terminal by said fifth means and to its base and said base of said third NPN transistor by said sixth means;
seventh means for providing a resistance;
a third PNP transistor having a collector coupled to said second voltage terminal, and an emitter coupled to said base of said second PNP transistor and coupled to its own base and said base of said third NPN transistor by said seventh means;
a fourth NPN transistor having a base and a collector coupled to said base of said third NPN transistor; and
a resistor coupled between an emitter of said fourth NPN transistor and said second voltage terminal.

* * * * *